United States Patent
Shibata

(10) Patent No.: US 7,965,095 B2
(45) Date of Patent: Jun. 21, 2011

(54) SEPARATE TESTING OF CONTINUITY BETWEEN AN INTERNAL TERMINAL IN EACH CHIP AND AN EXTERNAL TERMINAL IN A STACKED SEMICONDUCTOR DEVICE

(75) Inventor: Kayoko Shibata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 216 days.

(21) Appl. No.: 12/328,129

(22) Filed: Dec. 4, 2008

(65) Prior Publication Data

US 2009/0153177 A1 Jun. 18, 2009

(30) Foreign Application Priority Data

Dec. 7, 2007 (JP) ................................. 2007-317078

(51) Int. Cl.
*G01R 31/26* (2006.01)
(52) U.S. Cl. .................................. 324/762.02
(58) Field of Classification Search .......................... None
See application file for complete search history.

(56) References Cited

U.S. PATENT DOCUMENTS

| | | | | |
|---|---|---|---|---|
| 6,531,337 | B1 * | 3/2003 | Akram et al. | 438/108 |
| 6,603,198 | B2 * | 8/2003 | Akram et al. | 257/686 |
| 7,531,905 | B2 * | 5/2009 | Ishino et al. | 257/777 |
| 7,576,413 | B2 * | 8/2009 | Ishihara et al. | 257/621 |
| 2003/0209791 | A1 * | 11/2003 | Akram et al. | 257/678 |
| 2005/0082664 | A1 * | 4/2005 | Funaba et al. | 257/724 |
| 2006/0001176 | A1 * | 1/2006 | Fukaishi et al. | 257/777 |
| 2008/0061402 | A1 * | 3/2008 | Ishihara et al. | 257/621 |
| 2008/0290341 | A1 * | 11/2008 | Shibata | 324/763 |
| 2009/0096478 | A1 * | 4/2009 | Keeth | 324/765 |

FOREIGN PATENT DOCUMENTS

| | | |
|---|---|---|
| JP | 2002-305283 | 10/2002 |
| JP | 2004-030528 | 1/2004 |
| JP | 2006-120812 | 5/2006 |
| JP | 2007-157266 | 6/2007 |

* cited by examiner

*Primary Examiner* — Jermele M Hollington
(74) *Attorney, Agent, or Firm* — Young & Thompson

(57) ABSTRACT

A stacked semiconductor device is disclosed which is capable of conducting a test to determine whether or not there is continuity between an external terminal and a corresponding internal terminal in each chip, on an internal terminal-in each chip basis. The semiconductor device includes continuity test dedicated terminals for each chip, and continuity test elements each connected between an internal terminal in each chip and a continuity test dedicated terminal associated with the chip. A voltage is applied between an external terminal associated with an internal terminal whose connection status is to be checked and a continuity test dedicated terminal associated with a chip which includes the internal terminal such that a continuity test element associated with the internal terminal is rendered conductive. Thereafter, the value of current that flows through the continuity test element is measured to determine the connection status of the internal terminal.

20 Claims, 6 Drawing Sheets

SEPARATE TESTING OF CONTINUITY BETWEEN AN INTERNAL TERMINAL IN EACH CHIP AND AN EXTERNAL TERMINAL IN A STACKED SEMICONDUCTOR DEVICE

This application is based upon and claims the benefit of priority from Japanese patent application No. 2007-317078 filed on Dec. 7, 2007, the disclosure of which is incorporated herein in its entirety by reference.

BACKGROUND OF THE INVENTION

1. Field of the Invention

The present invention relates to a stacked semiconductor device wherein a plurality of different or identical chips are stacked using through-hole electrodes, and more particularly to a method of testing continuity between an internal terminal in each chip and an external terminal.

2. Description of the Related Art

In recent years, semiconductor packages wherein a plurality of chips are stacked using through-hole electrodes have been developed (see, for example, JP2002-305283A).

FIG. 1 illustrates an exemplary configuration of a semiconductor package wherein a plurality of memory core chips and an interposer chip are stacked together.

A signal which is applied to external terminal 5 is transmitted to each memory core chip 2 through through-hole electrodes 4 and internal terminal junctions 3. For this reason, it is necessary to ensure that the connection status of neighboring chips at internal terminal junctions 3 is good.

In a semiconductor package wherein a plurality of chips are stacked for assembly, it is desirable to conduct a test to determine whether or not there are any defects in the connection between chips prior to testing the operation of the circuits in each chip. By conducting a test of connection between chips beforehand, it is possible to detect and exclude a package having assembly defect(s). This enables a more efficient test of the operation of the circuits to be subsequently conducted.

Heretofore, a test to determine whether or not there is continuity between an internal terminal in each chip an external terminal of a package is conducted in such a way that a diode element which is intended to protect against ESD (electrostatic destruction) and which is connected between GND (ground terminal) and an external terminal is used and a voltage is applied across the diode element which causes current to flow through the diode element.

A description will now be given for a conventional method of conducting a test to determine whether or not an internal terminal in each memory core chip 2 is connected with external terminal 5 through internal terminal junction 3, through-hole electrode 4 and interposer chip 1 in the stacked semiconductor device shown in FIG. 1. Here, a check to determine whether or not internal terminal junctions 3, which are generated when stacking chips, are connected in a secure manner, is also carried out.

FIG. 2 illustrates the detailed configuration of an input/output section of a stacked semiconductor device of the related art. This semiconductor device includes interposer chip 1, 14 memory core chips 2a, 2b, . . . , 2n which are stacked one above another, and external terminals 5-1, 5-2, and 5-3. Neighboring chips are connected one above another by through-hole electrodes (not referenced in FIG. 2) and internal terminal junctions 3ab, 3mn. Memory core chip 2a includes internal circuit 20a, input circuits 11a1 and 11a2, data input/output circuit 12a, internal terminals 13a1, 13a2, 13a3, and diode elements 14a1, 14a2, 14a3. Similarly, memory core chip 2b includes internal circuit 20b, input circuits 11b1, 11b2, data input/output circuit 12b, internal terminals 13b1, 13b2, 13b3, and diode elements 14b1, 14b2, 14b3. Memory core chip 2n includes internal circuit 20n, input circuits 11n1 and 11n2, data input/output circuit 12n, internal terminals 13n1, 13n2, 3n3, and diode elements 14n1, 14n2, 14n3. The through-hole electrodes in each memory core chip are connected with internal terminals 13a1, 13a2, . . . , 13n3 in each chip. Diode elements 14a1, 14a2, . . . , 14n3 are the aforementioned diode which is intended to protect against ESD. Each through-hole electrode is electrically connected with corresponding external terminals 5-1, 5-2 and 5-3. In FIG. 2, an external terminal and a through-hole electrode for GND terminal are not shown.

A description is made of conducting a test to determine whether or not there is continuity between an external terminal and a corresponding internal terminal in each chip in the stacked semiconductor device. First, 0 (volt) is applied to GND terminal and a minus level voltage (for example −1 Volt) is applied to external terminal 5-1. That is, a test is made to determine whether or not there is continuity between external terminal 5-1, internal terminal 13a1 in memory core chip 2a, internal terminal 13b1 in memory core chip 2b, . . . , and internal terminal 13n1 in memory core chip 2n. Next, the value of current generated between external terminal 5-1 and GND terminal is measured. The value of current that is measured is herein the total of the value of current flowing through diode element 14a1, the value of current flowing through diode element 14b1, . . . , and the value of current flowing through diode element 14n1. If all memory core chips 2a, 2b, . . . , and 2n are connected one above another properly, the value of current that is measured should be 14 times the value of current flowing through diode element 14a1. However, if, for example, internal terminal junction 3ab has any trouble and is incompletely connected between memory core chips 2a and 2b, then only the value of current flowing through diode element 14a1 in memory core chip 2a is measured. Furthermore, if an internal terminal junction which has caused a problem is internal terminal junction 3mn, for example, then the total value of current flowing through the diodes except for diode element 14n1 is measured. In the latter case, the total value of current measured is approximate to the total value of current when all the internal terminal junctions are connected to outer terminal 5-1. The same applies to internal terminals 13a2, 13b2, . . . , 13n2 to be connected to outer terminal 5-2, and to internal terminals 13a3, 13b3, . . . , 13n3 to be connected to outer terminal 5-3.

In addition, the states of all the internal terminal junctions are not always the same. Some internal terminal junctions may have their resistance values greater than the expected value. Resistance values of the internal terminal junctions are thus not a fixed value. In this case, the value of current to be measured is not always an integral multiple of the value of current flowing through one diode element.

JP2006-120812A discloses a semiconductor device having a plurality of stacked chips wherein at the time of normal operation, test stabs are disconnected from main signal wirings to thereby improve the quality of signals during normal operation.

As described above, in a semiconductor device having identical chips which are stacked using through-electrodes, corresponding input terminals in each chip are all connected in series with one above another. Therefore, if a test to determine whether or not there are defects in the connection between chips is conducted in the aforementioned manner, then current flows through all the diode elements connected with GND terminal. As a result, even if a chip having a defective connection is present, it is difficult to identify the chip having a defective connection.

Also, in a semiconductor device having different chips which are stacked, an internal terminal junction to communicate with signals between the neighboring chips does not correspond to an external terminal. Therefore, a continuity test cannot be conducted because the internal terminal junction cannot be seen as the external terminal. As a result, whether or not there are defects in the connection between chips cannot be seen until a test to determine whether or not the circuits in a semiconductor package operate properly, is conducted, and cannot be easily found prior to testing the operation of the circuits.

SUMMARY OF THE INVENTION

It is an object of the present invention to provide a stacked semiconductor device which is capable of conducting a test to determine whether or not there is continuity between an external terminal and a corresponding internal terminal in each chip, on an internal terminal-in each chip basis.

It is another object to provide a method of testing continuity between an internal terminal in each chip and an external terminal, on an internal terminal-in each chip basis.

The semiconductor device according to the present invention includes continuity test dedicated terminals for each chip, and continuity test elements each connected between an internal terminal in each chip and a continuity test dedicated terminal associated with the chip.

A voltage is applied between an external terminal associated with an internal terminal whose connection status is to be checked and an continuity test dedicated terminal associated with a chip which includes the internal terminal such that a continuity test element associated with the internal terminal is rendered conductive. Thereafter, the value of current that flows through the continuity test element is measured to determine the connection state of the internal terminal.

Thus, the present invention makes it possible to conduct a test to determine whether or not there is continuity between an external terminal and a corresponding internal terminal in each chip, on an internal terminal-in each chip basis. Therefore, when an internal terminal having a defective connection is present, it is easy to identify a chip that includes the internal terminal having a defective connection.

The above and other objects, features and advantages of the present invention will become apparent from the following description with reference to the accompanying drawings which illustrate examples of the present invention.

EXEMPLARY EMBODIMENTS

First Exemplary Embodiment

Figure 3:
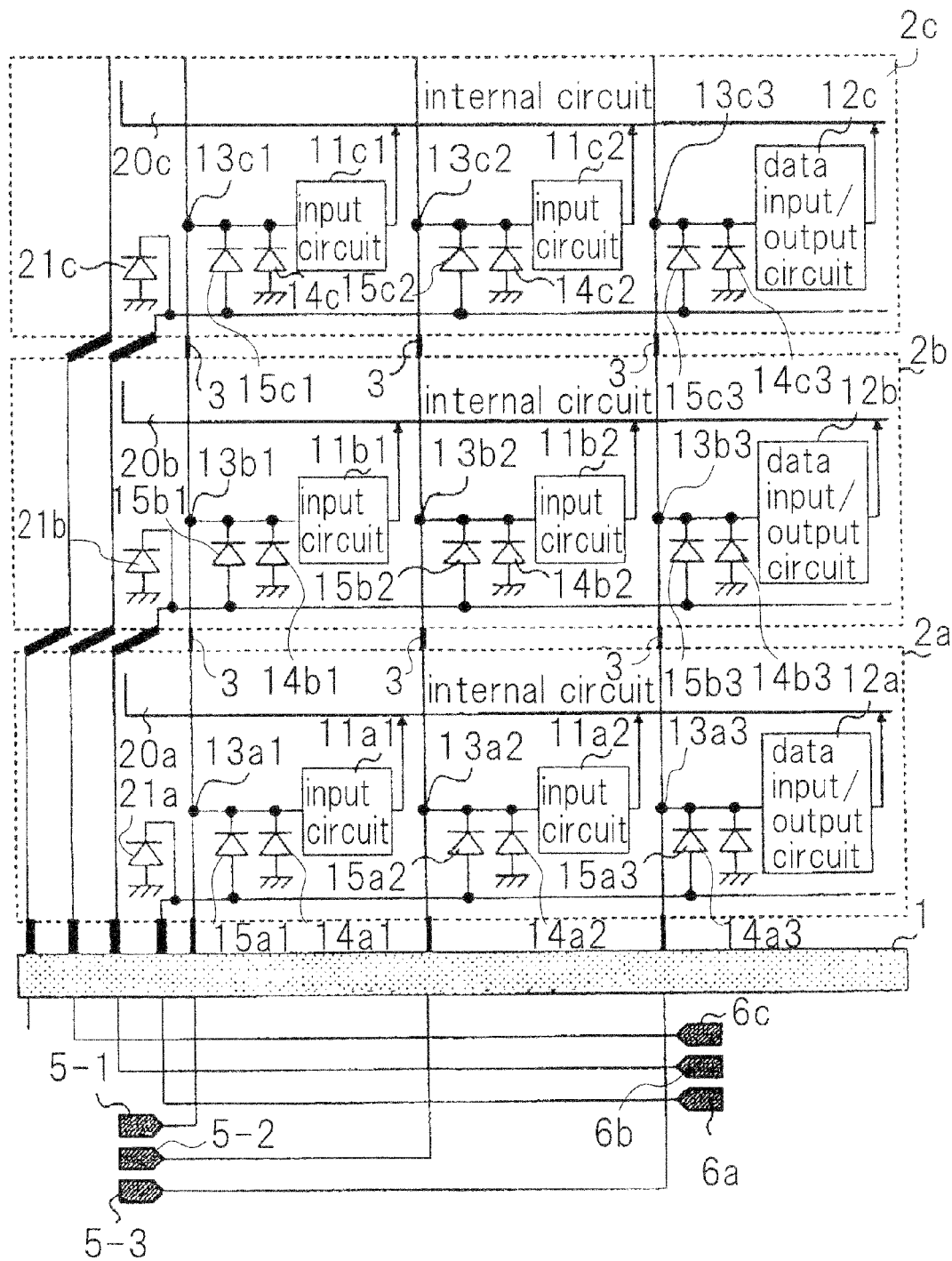
FIG. 3 is a detailed configuration of an input/output section of a stacked semiconductor device according to a first exemplary embodiment of the present invention.

FIG. 3 illustrates the detailed configuration of an input/output section of a semiconductor device according to a first exemplary embodiment of the present invention.

This stacked semiconductor includes interposer chip 1, a plurality of identical chips 2a, 2b, 2c, ... that are stacked on interposer chip 1, external terminals 5-1, 5-2, 5-3, ..., and continuity test dedicated terminals 6a, 6b, 6c, ..., each associated with memory core chips 6a, 6b, 6c, ..., respectively, continuity test dedicated terminals 6a, 6b, 6c each associated with memory core chips 6a, 6b, 6c, respectively.

Memory core chip 2a includes internal circuit 20a, input circuit 11a1, 11a2, data input/output circuit 12a; internal terminal 13a1, 13a2 for providing input circuit 11a1, 11a2 with a signal to operate internal circuit 20a, respectively, internal terminal 13a3 for inputting data to data input/output circuit 12a and for outputting data from data input/output circuit 12a. Similarly, memory core chip 2b includes: internal circuit 20b; input circuit 11b1, 11b2, data input/output circuit 12b; internal terminal 13b1, 13b2 for providing input circuit 11b1, 11b2 with a signal to operate internal circuit 20b, respectively, internal terminal 13b3 for inputting data to data input/output circuit 12b and for outputting data from data input/output circuit 12b. Memory core chip 2c includes: internal circuit 20c; input circuit 11c1, 11c2, data input/output circuit 12c; internal terminal 13c1, 13c2 for providing input circuit 11c1, 11c2 with a signal to operate internal circuit 20c, respectively, internal terminal 13c for inputting data to data input/output circuit 12c and for outputting data from data input/output circuit 12c.

Internal terminals that have the same function in memory core chips 2a, 2b and 2c, i.e., internal terminals 13a1, 13b1 and 13c1 are connected one above another at internal terminal junction 3 between the memory chips via through-hole electrode (not referenced). Internal terminals 13a2, 13b2, 13c2 are connected one above another in a similar fashion. Internal terminals 13a3, 13b3, 13c3 are connected one above another in a similar fashion. Internal terminals 13a1, 13b1 and 13c1 are connected with external terminal 5-1 through wirings (not shown) on interposer chip 1. Internal terminals 13a2, 13b2 and 13c2 are connected with external terminal 5-2 through wirings (not shown) on interposer chip 1. Internal terminals 13a3, 13b3 and 13c3 are connected with external terminal 5-3 through wirings (not shown) on interposer chip 1. Formed on interposer chip 1 are means (for example, through-hole electrodes, bonding pads, etc., not shown) for converting the wiring patterns with external terminals 5-1, 5-2, 5-3. This means also serves to convert the positions between the internal terminals and the external terminals.

Connected between internal terminals 13a1, 13a2, 13a3 and continuity test dedicated terminal 6a are continuity check diodes 15a1, 15a2 and 15a3, respectively. Connected between internal terminals 13a1, 13a2, 13a3 and GND terminal are ESD protection diodes 14a1, 14a2 and 14a3, respectively. Connected between internal terminals 13b1, 13b2, 13b3 and continuity test dedicated terminal 6b are continuity check diodes 15b1, 15b2 and 15b3, respectively. Connected between internal terminals 13b1, 13b2, 13b3 and GND terminal are ESD protection diodes 14b1, 14b2 and 14b3, respectively. Connected between internal terminals 13c1, 13c2, 13c3 and continuity test dedicated terminal 6c are continuity check diodes 15c1, 15c2 and 15c3, respectively. Connected between internal terminals 13c1, 13c2, 13c3 and GND terminal are ESD protection diodes 14c1, 14c2 and 14c3, respectively. The GND terminal is common to all the layers of the semiconductor device.

The aforementioned continuity test dedicated terminals that are present are as many as the chips that are stacked. When the identical chips are stacked, the positions of the terminals are the same. However, by changing the connections among metal wirings on a chip, a connection between the terminal and the neighboring through-hole electrode is possible (see, for example, JP2002-305283A). That is, even when stacking identical memory core chips, by forming a conducting path via different through-hole electrodes 4, it is possible to provide a continuity test dedicated terminal for each chip.

For continuity test dedicated terminals 6a, 6b and 6c, continuity test dedicated terminal ESD elements 21a, 21b and 21c are respectively provided for the suppression of ESO that is generated through respective continuity test dedicated terminals 6a, 6b and 6c.

Continuity test dedicated terminals 6a, 6b and 6c are also connected at internal terminal junction 3 between the memory core chips. In this case, by adopting a configuration wherein continuity test dedicated terminals 6a, 6b and 6c are connected between memory chips via a plurality of internal terminal junctions 3, a poor connection that is attributable to internal terminal junction 3 can be avoided.

The operation of the stacked semiconductor device having the aforementioned configuration will now be explained below.

When a check of the connection status of internal terminals 13a1, 13a2 and 13a3 in memory core chip 2b is conducted, continuity test dedicated terminal 6a is used. In this case, −1 (Volt) is applied to external terminal 5-1 and 0 (Volt) is applied to continuity test dedicated terminal 6a. Current that flows through continuity check diode 15a1 disposed between internal terminal 13a1 and continuity test dedicated terminal 6a also flows to external terminal 5-1. If some problem occurs at internal terminal junction 3, which makes the latter to be poorly connected, then the value of the aforementioned current is zero or is small. The value is measured by a current measurement device (not shown) and is used to determine the connection state of internal terminal 13a1. Similarly, −1 (volt) is applied to external terminal 5-2 and 0 (volt) is applied to continuity test dedicated terminal 6a. Current that flows through continuity check diode 15a2 disposed between internal terminal 13a2 and continuity test dedicated terminal 6a also flows to external terminal 5-2. When the value of this current is measured, then the connection state of internal terminal 13a2 can be determined. The state of connection of internal terminal 13a3 can be determined by applying −1 (volt) to external terminal 5-3 and 0 (volt) to continuity test dedicated terminal 6a and by measuring current that is generated at external terminal 5-3.

When a check of the connection status of internal terminals 13b1, 13b2 and 13b3 in memory core chip 2b is conducted, continuity test dedicated terminal 6b is used. In this case, −1 (volt) is applied to external terminal 5-1, 5-2, and 5-3, respectively, and 0 (volt) is applied to continuity test dedicated terminal 6b. Current that flows through continuity check diode 14b1 disposed between internal terminal 13b1 and continuity test dedicated terminal 6b also flows to external terminal 5-1. When the value of this current is measured, then the state of connection of internal terminal 13b1 can be determined. Similarly, −1 (volt) is applied to external terminal 5-2 and 0 (volt) is applied to continuity test dedicated terminal 6b. Current that flows through continuity check diode 15b2 disposed between internal terminal 13b2 and continuity test dedicated terminal 6b also flows to external terminal 5-2. When the value of this current is measured, then the connection state of internal terminal 13b2 can be determined. Similarly, −1 (volt) is applied to external terminal 5-3 and 0 (volt) is applied to continuity test dedicated terminal 6b. Current that flows through continuity check diode 15b3 disposed between internal terminal 13b3 and continuity test dedicated terminal 6b also flows to external terminal 5-3. When the value of this current is measured, then the connection state of internal terminal 13b3 can be determined.

Checks of the connection status of internal terminals 13c1, 13c2, and 13c3 in memory core chip 2c are conducted in a manner described above. Since the values of currents measured at this time are independent values among chips 2a, 2b and 2c and among the internal terminals in each chip, determination of the connection status is possible with the values of the respective current alone. If the sizes of diode elements 15a1 to 15c3 are the same and if the connection status of continuity test dedicated terminals 6a, 6b and 6c are also the same, the values of current are approximately equal one another. This makes it possible to predict the value of current to be generated, including its error. Therefore, if the measured value of current which flows through the diode is above a predetermined value, a check of the connection status is determined as "pass (good)".

Second Exemplary Embodiment

Figure 1:
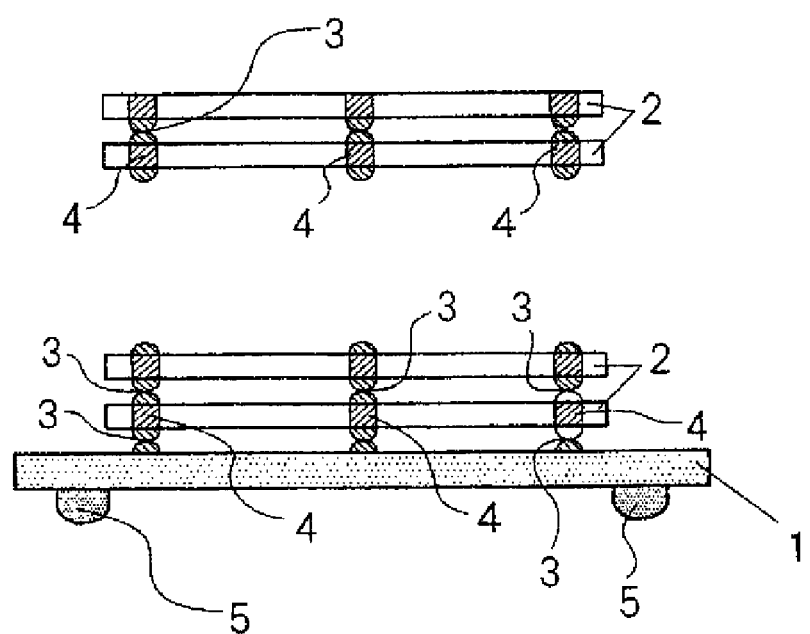
FIG. 1 is a schematic diagram illustrating an exemplary configuration of a semiconductor package.
Figure 2:
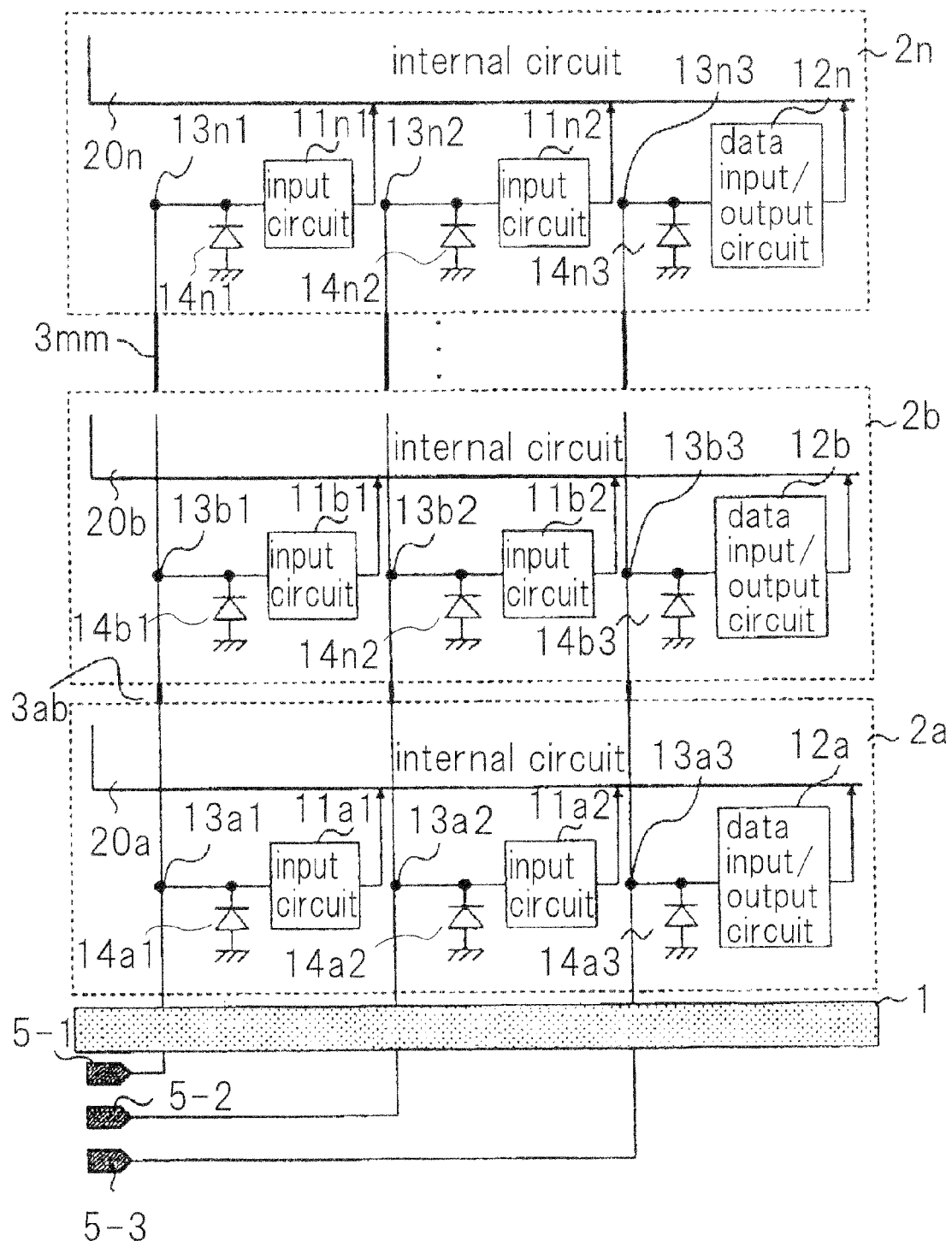
FIG. 2 is a view illustrating the detailed configuration of an input/output section of a stacked semiconductor device of the related art.
Figure 4A:
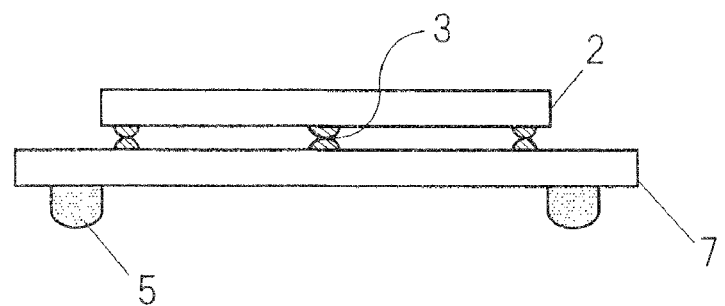
FIGS. 4a and 4b are schematic diagrams illustrating the configurations of another stacked semiconductor devices.
Figure 4B:
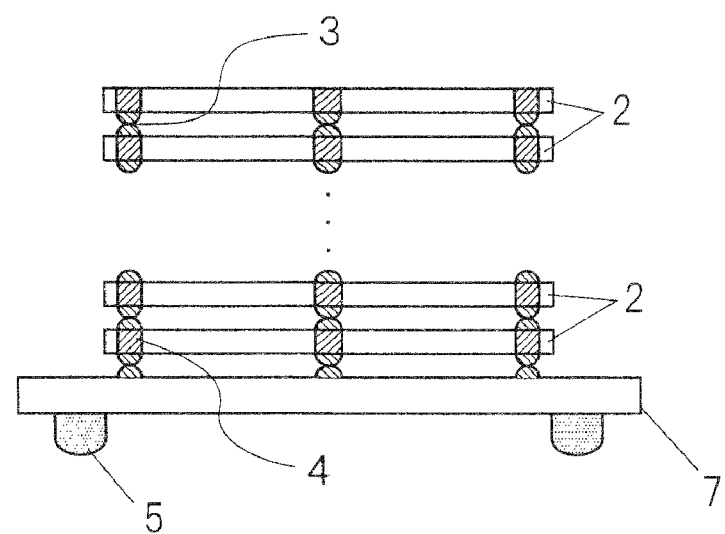

FIGS. 4a, 4b illustrate schematic configurations of another stacked semiconductor devices. The stacked semiconductor devices illustrated in FIGS. 4a, 4b differ from the stacked semiconductor device illustrated in FIG. 1 in that chips to be stacked include different chips (in this case, a memory core chip and an interface chip). FIG. 4a is an example in which the number of memory core chip 2 is one, and FIG. 4b is an example in which the number of memory core chip 2 is two. Interface chip 7 is a semiconductor chip which performs a specific circuit operation. Internal signals in memory core chip 2 and interface chip 7 communicate therebetween via internal terminal junction 3.

Figure 5:
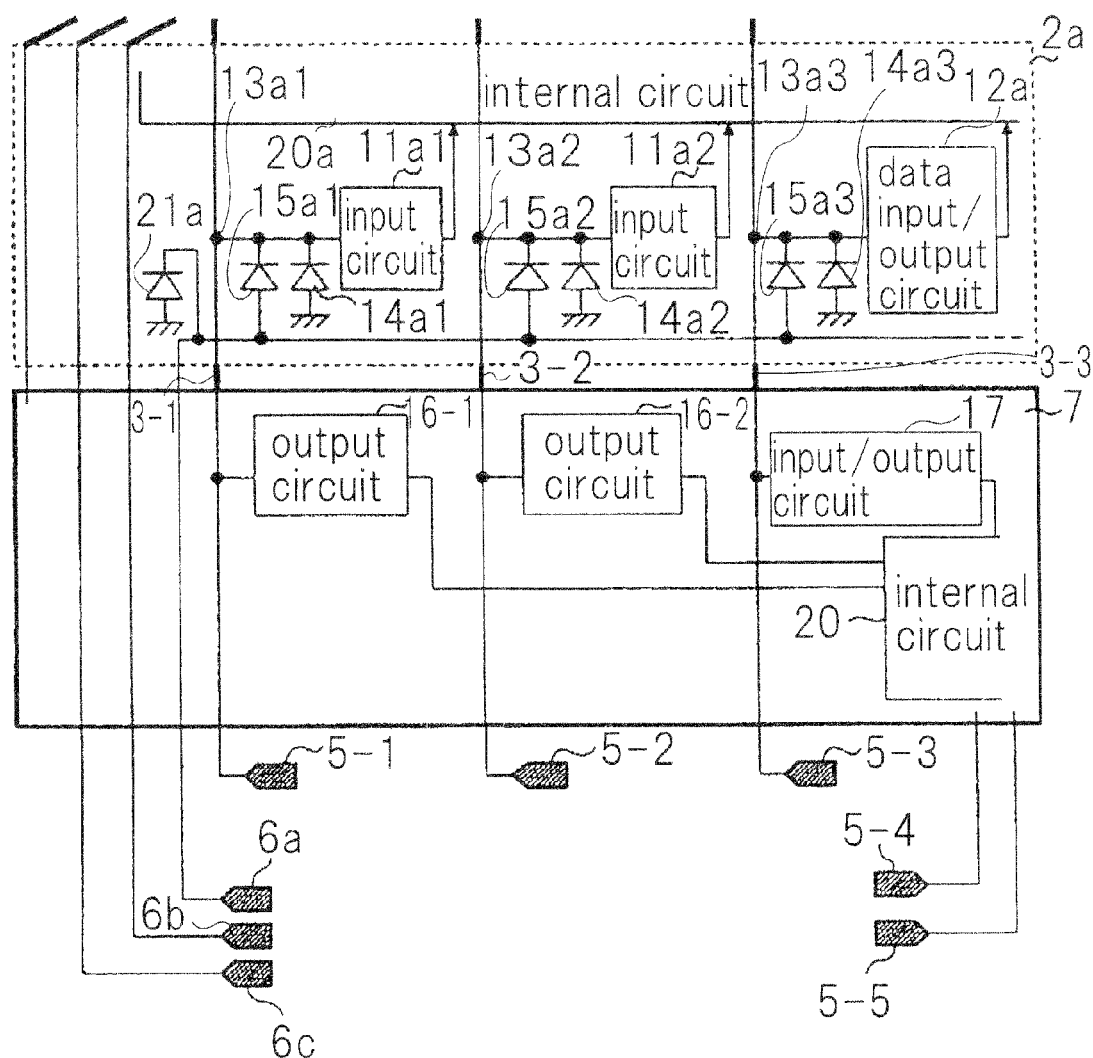
FIG. 5 is a view illustrating the detailed configuration of an input/output section of a stacked semiconductor device according to a second exemplary embodiment of the present invention.

FIG. 5 illustrates the detailed configuration of an input/output section of a semiconductor device according to a second exemplary embodiment. This exemplary embodiment is applied to the semiconductor device shown in FIG. 4b. The configurations of memory core chips 2a, 2b and 2c are the same as those of memory core chips 2a, 2b and 2c shown in FIG. 3, and memory core chips 2b and 2c are not shown. Interface chip 7 includes output circuits 16-1 and 16-2 for providing memory core chip 2a with signals to control memory cells in memory core chip 2a. The output terminal of output circuit 16-1 is connected with internal terminal 13a1 of memory core chip 2a via internal terminal junction 3-1. An input to output circuit 16-1 is supplied from internal circuit 20 in interface chip 7. Similarly, the output terminal of output circuit 16-2 is connected with internal terminal 13a2 of memory core chip 2a via internal terminal junction 3-2. An input to output circuit 16-2 is supplied from internal circuit 20 in interface chip 7. Interface chip 7 further includes input/output circuit 17 for transmitting data to the memory cells and receiving data from the memory cells in memory core chip 2a. One terminal of input/output circuit 17 is connected with internal terminal 13a3 of memory core chip 2a, and the other terminal of input/output circuit 17 is connected with internal circuit 20 in interface chip 7.

Internal terminals 13a1, 13a2 and 13a3 are connected with external terminals 5-1, 5-2 and 5-3, respectively, through interface chip 7. External terminals 54 and 5-5 are provided for inputting signals necessary for the control of internal circuit 20 in interface chip 7.

In addition, as with the first exemplary embodiment, continuity test dedicated terminals 6a, 6b and 6c for each memory core chip 2a, 2b and 2c are also provided. Continuity test dedicated terminals 6a, 6b and 6c are formed as an external terminal.

In the stacked semiconductor device having such a configuration, a check of the connection status of the internal terminals is conducted. A description is made of the check of the connection status of the internal terminals of first memory core chip 2a. When a check of the connection status of internal terminal 13a1 is conducted, −1 (volt) is applied to external terminal 5-1 and 0 (volt) is applied to continuity test dedicated terminal 6a. Then, the value of current which flows through continuity check diode 15a1 connected with internal terminal 13a1 and which is generated at external terminal 5-1, is measured and is used to check the connection status of internal terminal 13a1. The same procedure applies to checking the connection status of internal terminals 13a2 and 13a3.

Since external terminals 5-4 and 5-5 are connected with the circuit (internal circuit 20) alone in interface chip 7, their checks of the connection, status are conducted separately and easily.

Third Exemplary Embodiment

Figures 6A, 6B:
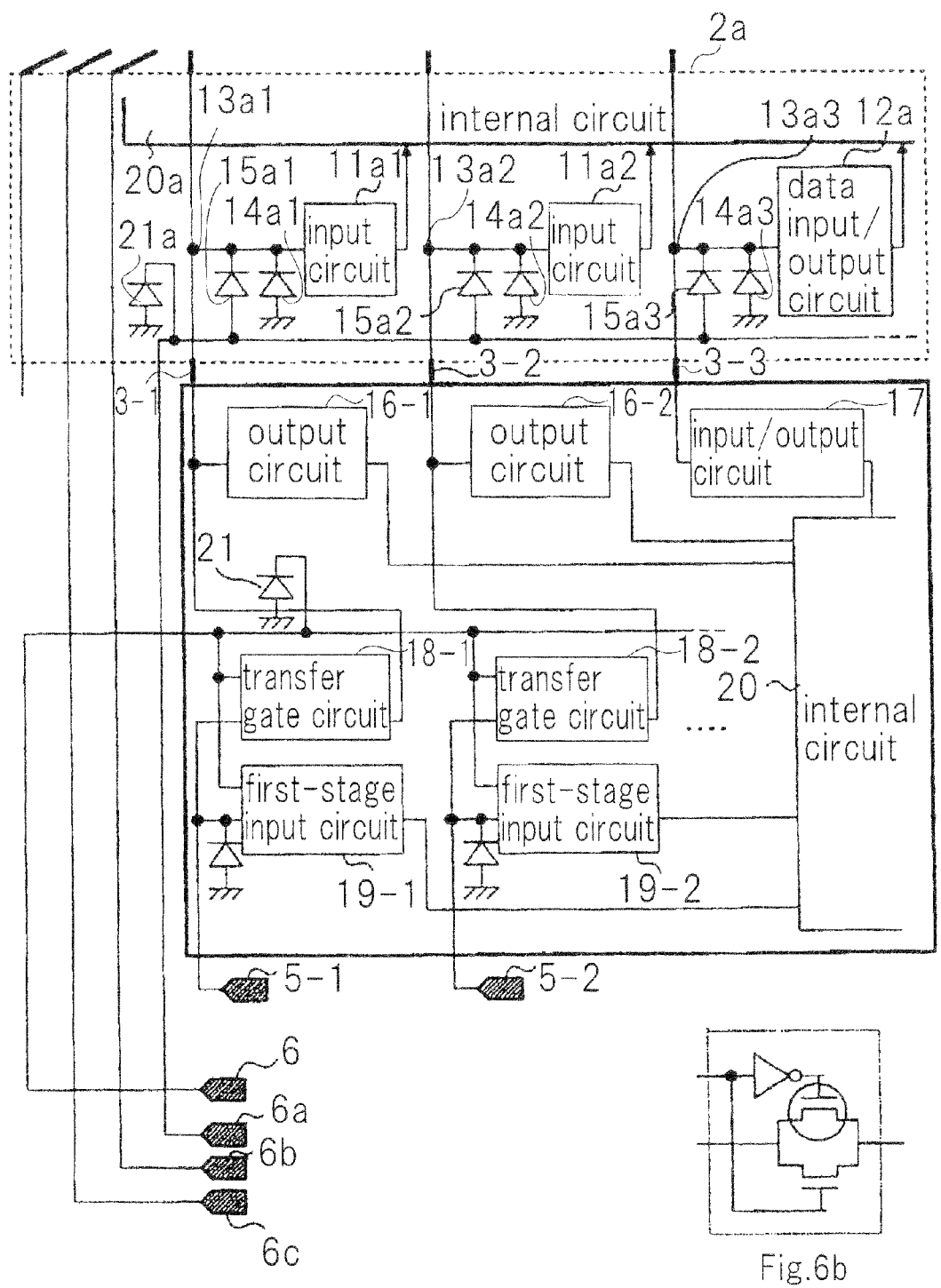
FIG. 6 is a view illustrating the detailed configuration of an input/output section of a stacked semiconductor device according to a third exemplary embodiment of the present invention.

FIG. 6a illustrates the detailed configuration of an input/output section of a semiconductor device according to a third exemplary embodiment. This exemplary embodiment is also applied to the semiconductor device shown in FIG. 4b. The present exemplary embodiment differs from the second exemplary embodiment in that external terminals 5-1, 5-2 for inputting control signals necessary for the control of internal circuit 20 in interface chip 7 are also used as external terminals to check the connection status of the internal terminals in memory core chip 2a. This reduces the number of external terminals of the stacked semiconductor device.

The detailed configuration will be described below. Interface chip 7 includes continuity test control terminal 6 and transfer gates 18-1, 18-2. In order to suppress ESD that is caused through continuity test control terminal 6, continuity test control terminal ESD element 21 is provided. Transfer gates 18-1 and 18-2 are of a conventional circuit design shown in FIG. 6b, and explanation of their circuit designs is omitted. External terminal 5-1 has an ESD protection element and is connected with internal circuit 20 via first-stage input circuit 19-1. External terminal 5-1 is also connected with internal terminal 13a1 via transfer gate circuit 18-1. Connected with first-stage input circuit 19-1 and transfer gate circuit 18-1 is continuity test control terminal 6 which controls conduction path of a signal to be applied to external terminal 5-1. Similarly to external terminal 5-1, external terminal 5-2 is connected with internal circuit 20 via first-stage input circuit 19-2, and is connected with internal terminal 13a2 in memory core chip 2a via transfer gate circuit 18-2. The respective first-stage input circuits and transfer gates constitute a switching circuit.

When performing a check of the connection status of internal terminal 13a1 in the circuit having a configuration described above, a high-level signal is applied to continuity test control terminal 6. Since transfer gate circuits 18-1, 18-2 are designed to be made conductive and since first-stage input circuits 19-1, 19-2 are designed to be inoperative at this time, external terminal 5-1 is made conductive to internal terminal 13a1 via internal terminal junction 3-1. At this time, after applying −1 (volt) to external terminal 5-1 and 0 (volt) to continuity test dedicated terminal 6a, the value of current generated at external terminal 5-1 is measured. The connection status of internal 13a1, i.e., good/bad, can thus be determined. The ESD protection diode connected with the input end of external terminal 5-1 affects on the determination because it is connected with GND. When a continuity test is not performed, a low level signal is applied to continuity test control terminal 6. As a result, transfer gates 18-1 and 18-2 are rendered non-conductive and external terminals 5-1 and 5-2 can thus be used as terminals for the control of internal circuit 20 in interface chip 7.

By thus changing a signal-flow path between the time of checking the connection status of the internal terminals and the time of normal operation, it is possible to use external terminals at the time of normal operation as measurement terminals at the time of checking the connection status of the internal terminals. This leads to the reduction in the number of external terminals in interface chip 7.

While preferred exemplary embodiments of the present invention have been described using specific terms, such description is for illustrative purposes only, and it is to be understood that changes and variations may be made without departing from the spirit or scope of the following claims.

What is claimed is:

1. A stacked semiconductor device comprising:
    a plurality of different or identical chips stacked using through-hole electrodes, each of said plurality of chips including an internal circuit, one or more input circuits for the internal circuit, a data input/output circuit for the internal circuit, one or more internal terminals each connected with each input circuit and with the data input/output circuit, and one or more continuity test elements each associated with each internal terminal;
    continuity test dedicated terminals each associated with each of said plurality of chips; and
    one or more external terminals each connected to each of the associated internal terminals by the through-hole electrode,
    wherein first ones of said continuity test elements each have a first terminal connected to the associated internal terminal and a second terminal different than the first terminal connected to the continuity test dedicated terminal associated with a chip which includes the respective said continuity test element.

2. The semiconductor device according to claim 1, wherein said continuity element comprises a diode element.

3. The semiconductor device according to claim 1, further comprising an interposer chip,
    wherein said plurality of chips are identical memory core chips that are stacked on said interposer chip, wherein said internal terminals in neighboring said memory core chips are connected together through an internal terminal junction on the through-hole electrode, and wherein each external terminal and the associated one of internal terminals are connected together through wirings on said interposer chip.

4. The semiconductor device according to claim 1, further comprising an interface chip,
    wherein said plurality of chips are identical memory core chips that are stacked on said interface chip, wherein each of said continuity test dedicated terminals and the associated continuity test elements are connected through said interface chip, and wherein each external terminal and the associated one of internal terminals are connected through said interface chip.

5. The semiconductor device according to claim 1, further comprising an interface chip having said external terminal, wherein said external terminal is used for controlling an internal circuit of said interface chip.

6. The semiconductor device according to claim 5, wherein said plurality of chips are identical memory core chips that are stacked on said interface chip.

7. The semiconductor device according to claim 6, wherein said interface chip includes a continuity test control terminal, and a switching circuit for connecting the internal terminal in each memory core chip with the associated external terminal when a signal to test the connection state of said internal terminal in the memory core chip is applied to said continuity test control terminal, and for connecting an interface internal circuit in said interface chip with the external terminals when a signal to carry out the normal operation of said interface chip is applied to said continuity test control terminal.

8. The semiconductor device according to claim 7, wherein said switching circuit includes a first-stage input circuit for connecting said interface internal circuit with said external terminals when the signal to carry out the normal operation of said interface chip is applied to said continuity test control terminal, and a transfer gate circuit for connecting the internal terminals with the corresponding external terminal when said signal to test the connection state of said internal terminal in the memory core chip is applied to said continuity test control terminal.

9. A stacked semiconductor device comprising:
a plurality of chips that are connected together by through-hole electrodes;
external terminals; and
continuity test dedicated terminals each associated with each of said plurality of chips,
wherein each of said plurality of chips comprises continuity test elements and internal terminals connected to an internal circuit of the chip, wherein each of the continuity test elements is connected in series between the associated internal terminal and the continuity test dedicated terminal associated with a chip which includes the respective said continuity test element, and
wherein each of the external terminals is connected to each of the associated internal terminals by the through-hole electrode.

10. The semiconductor device according to claim 9, wherein said continuity element comprises a diode element.

11. The semiconductor device according to claim 9, wherein said plurality of chips are identical memory core chips.

12. The semiconductor device according to claim 11, further comprising an interposer chip having said external terminals, wherein said memory core chips are stacked on the interposer chip.

13. The semiconductor device according to claim 11, further comprising an interface chip having said external terminals, wherein said memory core chips are stacked on the interface chip.

14. The semiconductor device according to claim 13, further comprising a continuity test control terminal, a interface internal circuit for controlling the interface chip, and a switching circuit in the interface chip,
wherein the switching circuit connects the internal terminal to the associated external terminal when a signal for testing the connection state of the internal terminal is applied to the continuity test control terminal, and wherein the switching circuit connects the interface internal circuit to the external terminal when a signal for normal operation of said interface chip is applied to the continuity test control terminal.

15. A method of testing a connection status of a stacked semiconductor device comprising:
preparing a stacked semiconductor device comprising a plurality of chips that are connected together by through-hole electrodes, external terminals and continuity test dedicated terminals each associated with each of said plurality of chips, wherein each of said plurality of chips comprises continuity test elements and internal terminals connected to an internal circuit of the chip, wherein each of the continuity test elements has a first terminal connected to the associated internal terminal and a second terminal different than the first terminal connected to the continuity test dedicated terminal associated with a chip which includes said continuity test element, and wherein each of the external terminals is connected to each of the associated internal terminals by the through-hole electrode;
applying a voltage between the external terminal and the continuity test dedicated terminal; and
measuring the value of current flowing between the external terminal and the continuity test dedicated terminal.

16. The method according to claim 15, further comprising making an electrical path between the external terminal and the internal terminal before applying a voltage between the external terminal and the continuity test dedicated terminal.

17. A semiconductor device comprising:
a first semiconductor chip including first and second internal terminal junctions and a first test element coupled between the first and second internal terminal junctions;
a first external terminal outside the first semiconductor chip and electrically connected to the first internal terminal junction; and
a first test terminal outside the first semiconductor chip and electrically connected to the second internal terminal junction to form a first electrical path between the first external terminal and the first test terminal, via the first test element and the first and second internal terminal junctions.

18. The semiconductor device of claim 17, further comprising:
a second semiconductor chip including third and fourth internal terminal junctions and a second test element coupled between the third and fourth internal terminal junctions, the second semiconductor chip being stacked over the first semiconductor chip so that the third internal terminal junction is electrically connected to the first internal terminal junction, whereby the first external terminal is electrically connected to the third internal terminal junction; and
a second test terminal outside the first and second semiconductor chips and electrically connected to the fourth internal terminal junction to form a second electrical path between the first external terminal and the second test terminal, via the second test element and the third and fourth internal terminal junctions.

19. The semiconductor device of claim 18, wherein the first semiconductor chip further comprises a fifth internal terminal junction and the second semiconductor chip further comprises a sixth internal terminal junction electrically connected to the fifth internal terminal junction, the semiconductor device further comprising a second external terminal outside the first and second semiconductor chips and electrically connected to the fifth internal terminal junction.

20. The semiconductor device of claim 19, wherein the first semiconductor chip further comprises a third test element coupled between the fifth and second internal terminal junctions, and wherein the second semiconductor chip further comprises a fourth test element coupled between the sixth and fourth internal terminal junctions, whereby a third electrical path is formed between the second external terminal and the first test element via the third test element and the fifth and second internal terminal junctions, and whereby a fourth electrical path is formed between the second external terminal and the second test terminal via the fourth test element and the sixth and fourth internal terminal junctions.

* * * * *